(12) United States Patent
Zengerle et al.

(10) Patent No.: US 9,351,433 B2
(45) Date of Patent: May 24, 2016

(54) OPERATING A CURRENT CONVERTER AT A PATH OF TRAVEL OF LAND VEHICLES OR AT A PARKING SPACE OF A LAND VEHICLE

(71) Applicant: Bombardier Transportation GmbH, Berlin (DE)

(72) Inventors: Manfred Zengerle, Ebertsheim (DE); Hans-Heinrich Reimers, Mannheim (DE)

(73) Assignee: Bombardier Transportation GmbH, Berlin (DE)

( * ) Notice: Subject to any disclaimer, the term of this patent is extended or adjusted under 35 U.S.C. 154(b) by 67 days.

(21) Appl. No.: 14/388,524

(22) PCT Filed: Mar. 22, 2013

(86) PCT No.: PCT/EP2013/056076
§ 371 (c)(1),
(2) Date: Sep. 26, 2014

(87) PCT Pub. No.: WO2013/144014
PCT Pub. Date: Oct. 3, 2013

(65) Prior Publication Data
US 2015/0116936 A1   Apr. 30, 2015

(30) Foreign Application Priority Data

Mar. 27, 2012   (GB) .................................. 1205439.1

(51) Int. Cl.
*H05K 7/20*   (2006.01)
*B60L 11/18*   (2006.01)
(Continued)

(52) U.S. Cl.
CPC ........ *H05K 7/20909* (2013.01); *H05K 7/20927* (2013.01); *B60L 5/00* (2013.01); *B60L 11/1835* (2013.01); *B60M 1/34* (2013.01)

(58) Field of Classification Search
CPC combination set(s) only.
See application file for complete search history.

(56) References Cited

U.S. PATENT DOCUMENTS 5,461,299 A * 10/1995 Bruni .................... B60L 11/182
                                                   320/108
5,909,099 A    6/1999 Watanabe et al.
(Continued)

FOREIGN PATENT DOCUMENTS

CN    201608217 U    10/2010
DE    4114576 A1    10/1991
(Continued)

*Primary Examiner* — Gregory Thompson
(74) *Attorney, Agent, or Firm* — The Webb Law Firm

(57) ABSTRACT

The invention relates to an arrangement for operating a current converter, in particular an inverter, wherein the converter is located at a path of travel of land vehicles or at a parking space of a land vehicle, the converter being adapted to support operation of at least one vehicle, the converter is combined with a cooling device adapted to cool the converter during operation, the cooling device is designed to use a heat transport medium in order to transport heat away from the converter, the arrangement comprises at least one pole and/or at least one supporting structure which is also located at the path of travel or at the parking space, the pole and/or the supporting structure extends upwards from ground, the arrangement comprises a conduct for conducting the heat transport medium and the conduct extends from the cooling device to the pole and/or to the supporting structure and also extends inside the pole and/or inside the supporting structure so that heat can be transferred from the heat transport medium inside the pole and/or inside the supporting structure to the ambiance.

8 Claims, 2 Drawing Sheets

(51) Int. Cl.
*B60L 5/00* (2006.01)
*B60M 1/34* (2006.01)

(56) References Cited

U.S. PATENT DOCUMENTS

| | | | |
|---|---|---|---|
| 6,230,861 | B1 | 5/2001 | Cornic |
| 8,037,954 | B2 * | 10/2011 | Taguchi ............. B60H 1/00257 165/10 |
| 8,350,526 | B2 * | 1/2013 | Dyer ...................... B60L 1/003 320/104 |
| 8,913,386 | B2 | 12/2014 | Gradinger et al. |
| 9,022,190 | B2 * | 5/2015 | Anders .................. B60L 5/005 191/10 |
| 2001/0003416 | A1 | 6/2001 | Kajiura |
| 2011/0204845 | A1 * | 8/2011 | Paparo .................... H01F 38/14 320/108 |
| 2012/0043935 | A1 * | 2/2012 | Dyer ....................... B60L 1/003 320/109 |
| 2012/0043943 | A1 * | 2/2012 | Dyer ................... B60L 11/1809 320/137 |
| 2012/0203410 | A1 | 8/2012 | Wechlin et al. |
| 2012/0261482 | A1 | 10/2012 | Vollenwyder et al. |
| 2013/0112519 | A1 | 5/2013 | Anders |

FOREIGN PATENT DOCUMENTS

| | | |
|---|---|---|
| EP | 0962353 A1 | 12/1999 |
| JP | 10294579 A | 11/1998 |
| WO | 2010031595 A2 | 3/2010 |
| WO | 2011006884 A2 | 1/2011 |
| WO | 2011035943 A2 | 3/2011 |
| WO | 2011076434 A2 | 6/2011 |
| WO | 2011076435 A1 | 6/2011 |

* cited by examiner

US 9,351,433 B2

OPERATING A CURRENT CONVERTER AT A PATH OF TRAVEL OF LAND VEHICLES OR AT A PARKING SPACE OF A LAND VEHICLE

CROSS-REFERENCE TO RELATED APPLICATIONS

This application is the United States national phase of International Application No. PCT/EP2013/056076 filed Mar. 22, 2013, and claims priority to United Kingdom Patent Application No. 1205439.1 filed Mar. 27, 2012, the disclosures of which are hereby incorporated in their entirety by reference.

BACKGROUND OF THE INVENTION

1. Field of the Invention

The invention relates to an arrangement for operating a converter, in particular an inverter, wherein the converter is located at a path of travel of land vehicles or at a parking space of a land vehicle. The invention also relates to a method of operating a current converter, in particular an inverter, which is operated at a path of travel of land vehicles or at a parking space of a land vehicle.

2. Description of Related Art

In particular, the invention relates to the operation of converters, in particulars high power converters, for transferring electric energy to a land vehicle, such as a rail vehicle, truck, bus or automobile. According to a special application, the electric energy is transferred to the converter via a feed line, the converter converts the electric current through the feed line (for example, the converter converts a direct current to an alternating current), the converted electric current is used to produce a magnetic field and the magnetic field induces an electric voltage in a corresponding receiving device of a vehicle. An example of such a specific application is described in WO 2010/031595 A1.

It is known in the art that converters, in particular high power converters, produce heat during operation. The invention especially relates to high power converters which convert electric currents while transferring power rates of more than 1 kW. In traffic applications, such as transferring energy to vehicles while driving or while stopping (for example at a crossing of different paths of travel) or to a parking vehicle, the converter or converters may be buried in the ground, at least partly. An example of a corresponding arrangement of a converter and of a cooling system is given in WO 2011/076434 A1. One reason for burying the converter in the ground is that buried converters do not deteriorate the aesthetic appearance of the scene. However, converters are also buried for safety reasons. A disadvantage of burying converters in the ground is that it is more difficult to transfer the heat produced by the converter to the ambiance.

SUMMARY OF THE INVENTION

The preferred embodiment of the invention comprises a converter which is buried in the ground so that no part of the converter protrudes upwards from the ground surface. Therefore, it is particularly difficult to transfer the heat from the converter to the ambiance. For example, the converter may be located at a bus stop or at a different stopping point of vehicles travelling on a path of travel (such as at traffic lights) or at the stop of a rail vehicle, such as a tram. However, the converter may be located at any other location at the path of travel of a land vehicle or at a parking space of a land vehicle. In particular, as mentioned above, land vehicles can be provided with electric energy by induction during travel (i.e. while the speed is not zero) and, therefore, several converters may be distributed over the path of travel. For example, each converter is combined with a separate section of an arrangement for producing magnetic field. Each section of the arrangement extends along a corresponding section of the path of travel.

It is an object of the present invention to provide an arrangement for operating a converter, wherein the converter shall be cooled effectively during operation, although the converter may be buried in the ground at a path of travel of land vehicles or at a parking space of a land vehicle. It is a further object of the invention to provide a method of operating the converter.

According to a basic idea of the invention, heat is conducted away from the converter using a heat transport medium and a heat exchanger is integrated in a pole and/or a supporting structure, which is also located at the path of travel or at the parking space. However, the distance of the pole and/or supporting structure to the path of travel or the parking space may vary and/or may differ from the distance of the converter to the path of travel or parking space. In particular, the converter may be buries under the path of travel or parking space. The heat transfer medium is conducted from the converter to the heat exchanger and heat is transferred from the heat transfer medium via the heat exchanger to the ambiance.

In particular, the heat transfer medium is a liquid medium, such as a mixture of water and a frost protection agent. However, other liquids or fluids can alternatively be used as heat transfer medium.

The pole and/or the supporting structure extend(s) upwards from the ground in the area of the path of travel or parking space. Therefore, at least a part or section of the pole and/or supporting structure is located above ground and, therefore, heat can be transferred effectively via the heat exchanger from the heat transfer medium to the ambiance.

Preferably, the pre-dominant part of the heat exchanger or the whole heat exchanger is located above ground.

In many cases, a single pole or supporting structure is sufficient for the transfer of heat from the converter to the ambiance. However, more than one pole, more than one supporting structure and/or at least one pole and at least one supporting structure may be used to transfer heat from the same converter to the ambiance. Preferably, separate conduct loops are used to transfer heat transport media, and thereby heat, to the separate heat exchangers in the poles and/or supporting structures. However, the separate conduct loops may optionally branch-off at a common cooling device which is combined with the converter. For example, the common cooling device may have several branch connections for the respective forward sections and return sections of the conduct loops.

Independent of the number of conduct loops, i.e. the same applies to an embodiment in which the arrangement comprises a single conduct loop, the forward section of the loop and the return section of the loop both connect the converter or the cooling device, which is combined with the converter, with the heat exchanger in the pole or supporting structure. During operation of the conduct loop, the heat transport medium circulates from the converter or cooling device through the forward section, the heat exchanger and the return section back to the converter or cooling device.

In particular, the pole or supporting structure is located sideways of the path of travel of the land vehicles. Preferably, the pole or supporting structure not only has the function of transferring heat from the converter to the ambiance, but also has a second function. The second function may be one or more than one of the following:

signalling. For example, signalling poles are typically located sideways of roads for automobiles outside of villages or towns. The surface of the signalling poles may be designed according to the traffic regulations of the respective country. For example, light reflective areas may be located on the surface of the signalling pole. At least one of the signalling poles can be used in order to transfer heat from a converter to the ambiance.

traffic sign. The pole or support structure may be a traffic sign and/or may carry a traffic sign, such as a yield sign indicating that the vehicle has right of way. Alternatively, the pole and/or support structure may be or may carry any other traffic sign.

supporting and/or carrying other parts. The pole or supporting structure may support and/or carry any other part or parts. In particular, the supporting structure or pole may be part of any mechanical construction, for example a passenger protection structure at a bus stop or stop of a rail vehicle. Due to the fact that the heat will be transported to the pole or supporting structure by a heat transport medium, e.g. a liquid, the location of the pole or supporting structure is very flexible. Therefore, many other functions and/or positions are possible.

In particular, the following is proposed: An arrangement for operating a current converter, in particular an inverter, wherein the converter is located at a path of travel of land vehicles or at a parking space of a land vehicle, the converter being adapted to support operation of at least one vehicle, the converter is combined with a cooling device adapted to cool the converter during operation, the cooling device is designed to use a heat transport medium in order to transport heat away from the converter, the arrangement comprises at least one pole and/or at least one supporting structure which is also located at the path of travel or at the parking space, the pole and/or the supporting structure extends upwards from ground, the arrangement comprises a conduct for conducting the heat transport medium and the conduct extends from the cooling device to the pole and/or to the supporting structure and also extends inside the pole and/or inside the supporting structure so that heat can be transferred from the heat transport medium inside the pole and/or inside the supporting structure to the ambiance.

Furthermore, a method is proposed of operating a current converter, in particular an inverter, wherein the converter is operated at a path of travel of land vehicles or at a parking space of a land vehicle, the converter being adapted to support operation of at least one vehicle, a cooling device is used to cool the converter during operation, the cooling device uses a heat transport medium for transport of heat away from the converter, at least one pole and/or at least one supporting structure which is also located at the path of travel or at the parking space is used to transfer heat produced during operation of the converter to the ambiance, a conduct is used for conducting the heat transport medium from the cooling device to the pole and/or to the supporting structure and the heat transport medium is conducted through a section of the conduct inside the pole and/or inside the supporting structure so that heat is transferred from the heat transport medium inside the pole and/or the supporting structure to the ambiance.

The combination of a converter and a cooling device for cooling the converter is known in the art. For example, the cooling device may be a heat exchanger. According to a specific embodiment, the converter comprises semiconductor switches (e.g. IGBTs, Insulated Gate Bipolar Transistors) which are contained by at least one package, wherein the package has mechanical contact to a heat exchanger comprising at least one fluid channel through which the heat transport medium can flow during operation of the converter. In particular, the cooling device, such as the heat exchanger, may be integrated in the housing of the converter. However, according to an alternative embodiment, the cooling device, such as a heat exchanger, can be attached to the outside of the housing of the converter.

The converter can be combined with further electronic and/or electric devices, such as semiconductor switches, inductances, capacitances. It is possible that heat which is produced during operation of these additional electronic and/or electric devices is transported away to the ambiance in the same manner as the heat which is produced during operation of the converter.

"Located at a path of travel" and "located at a parking space" in particular means that the converter, pole or supporting structure is located next to the path of travel or parking space. It does not mean that the path of travel or parking space is blocked by the converter, pole or supporting structure.

The conduct which connects the cooling device and the pole and/or supporting structure may be any conduct for conducting a heat transport medium which is known in the art. For example, the conduct or at least a section of the conduct may be a pipe or a flexible hose. Any suitable material can be used for the conduct walls. In many cases, insulation against heat losses is not required for the conduct. For example, if some of the heat, which is transported by the heat transport medium, is transferred though the walls of the conduct to the ground, the cooling of the converter is improved. However, the major part (e.g. at least 50%, preferably at least 70%) of the heat power of the heat transfer to the ambiance is performed by the at least one pole and/or supporting structure.

In particular, if the converter is buried in the ground, it is preferred that the conduct extends through the ground and/or at the surface of the ground from the cooling device to the pole and/or to the supporting structure. If the conduct extends through the ground, and if the converter is buried in the ground, the only visible part of the arrangement is the pole and/or supporting structure. Furthermore, if the pole and/or the supporting structure is also used for other purposes than transferring heat to the ambiance, none of the components of the arrangement will catch the eye of a spectator. On the other hand, the pole and/or supporting structure allows for effective heat transfer from the converter to the ambiance.

Preferably, the converter is adapted to be operated continuously at higher temperatures as typical air temperatures which may occur in the ambiance of the converter. For example, the cooling device, which is combined with the converter, may be operated at temperatures up to approximately 60° C., which means that local temperatures of the converter may be higher. Therefore, the heat transport medium will have temperatures of around 60° C. and lower. Ambiance air temperatures even in warm climate regions are typically lower than these heat transport medium temperatures. Therefore, effective heat transfer to the ambiance air is possible.

In particular, the pole and/or to the supporting structure comprises cooling bodies extending away from the surface of the conduct inside the pole and/or inside the supporting structure for conducting heat away from the conduct through the material of the cooling bodies, wherein the pole and/or to the supporting structure also comprises at least one air channel which extends from an air inlet opening of the pole and/or of the supporting structure upwards to an air outlet opening of the pole and/or of the supporting structure and wherein at least one of the cooling bodies forms at least part of a wall of the at least one air channel.

The cooling bodies can be provided in the form of ribs or fins, which more generally speaking means that the individual cooling body extends in a lengthwise direction (in particular parallel to the flow direction of the heat transport medium) along the surface of the conduct and also extends in a direction transverse to the surface of the conduct away from the surface. Preferably, the thickness of the cooling body, if the extension in the transverse direction is considered, is smaller than the length of the extension away from the surface of the conduct in the transverse direction. Furthermore, it is preferred that at least one of the cooling bodies extends away from the surface of the conduct to an outer wall of the pole or supporting structure in which the conduct is integrated.

According to a preferred embodiment, at least two cooling bodies extend away from the surface of the conduct at a distance to each other so that air from the ambiance can flow through the space in between the two cooling bodies. According to the most preferred embodiment, more than two cooling bodies extend away from the surface of the conduct in such a manner that more than one air passage is formed outside of the conduct, wherein each air passage is defined by at least two of the cooling bodies. As mentioned above, the air passages may also delimited by an outer wall of the pole and/or supporting structure so that each air passage is completely enclosed by the outer wall, the cooling bodies and optionally by the conduct wall, if a cross section of the air passage is considered. According to an alternative embodiment, a part of the conduct's wall may also be part of the outer wall of the pole or supporting structure.

Embodiments of the method follow from the description of the embodiments of the arrangement. For example, according to an embodiment of the method, the heat transport medium is conducted inside the conduct through ground and/or at the surface of the ground from the cooling device to the pole and/or to the supporting structure.

According to a further possible embodiment of the method, heat from the conduct inside the pole and/or inside the supporting structure is conducted away from the surface of the conduct inside the pole and/or inside the supporting structure through material of at least one cooling body, wherein the heat is transferred from the at least one cooling body, which forms at least part of a wall of at least one air channel inside the pole and/or inside the supporting structure, to ambient air inside the air channel, while the ambient air flows from an air inlet opening of the pole and/or of the supporting structure upwards to an air outlet opening of the pole and/or of the supporting structure.

Since the pole and/or the supporting structure comprises an air inlet opening and an air outlet opening above the inlet opening, which are connected by at least one air channel, natural convection may occur. However, it is also possible that the ambiance air is conducted along the surface of the conduct and/or along the at least one cooling body by forced convection.

Preferably, the material of the conduct's wall or walls inside the pole and/or supporting structure as well as the material of the at least one cooling body have comparatively high thermal conductivity. For example, the wall or walls of the conduct and the at least one cooling body are made of metal, in particular aluminium. Preferably, the pole or supporting structure comprises the same cross-sectional shape at least along a section of the pole or supporting structure. Furthermore, at least such a section comprising a constant cross-sectional shape can be made by performing an extrusion process.

BRIEF DESCRIPTION OF THE DRAWINGS

Examples and further possible features of the invention will be described with reference to the attached figures. The figures show.

DESCRIPTION OF THE INVENTION

Figure 1:
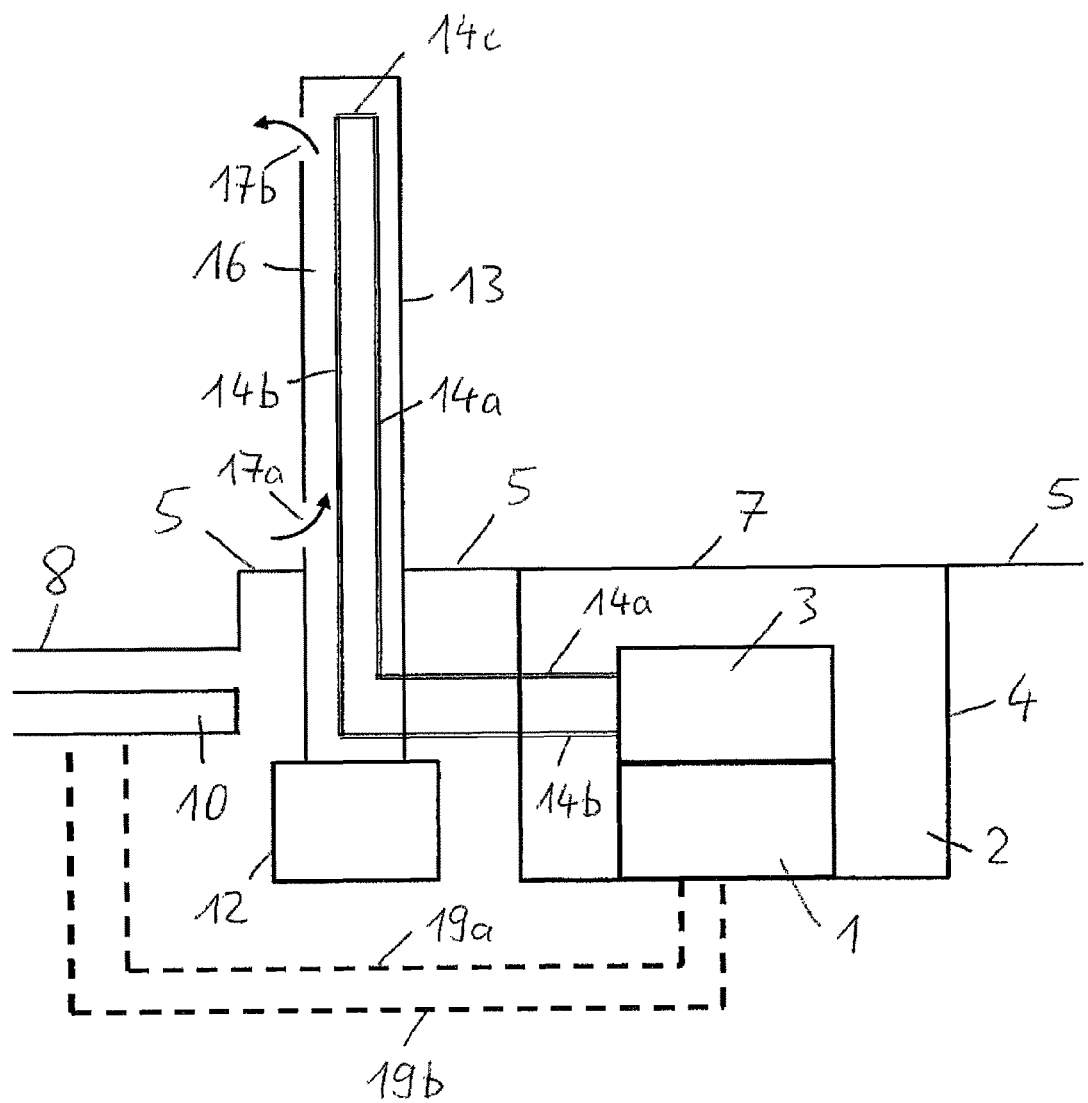
FIG. 1 schematically a side view or cross section of an arrangement.

FIG. 1 shows a converter 1 which is buried in the ground. The ground surface is denoted by reference numeral 5. The converter 1 is located in a cavity 2 having walls 4 and a lid 7. For example, the lid 7 extends on the same height level as the surface 5 of the ground.

On the left hand side of FIG. 1, the surface 5 of the ground steps down to a lower height level, the upper surface of which is formed by the material of a road 8 (i.e. a path of travel) for trucks, automobiles and/or busses. Alternatively, the area which is denoted by 8 may be a parking space for a land vehicle or the track of a rail vehicle. Below the surface of the road 8, parking space or track, there is an arrangement 10 of electric conductors which produce an alternating electromagnetic field during operation, in order to transfer energy to a vehicle by induction. The converter 1 produces the alternating current which is transferred to the arrangement 10 via electric connection lines 19a, 19b. Further electric connections of the converter 1, such as connections to a feed line, are not shown in FIG. 1. Furthermore, additional electronic and/or electric devices may also be located within the cavity 2, in particular within the same housing which contains the converter 1.

FIG. 1 schematically shows that a cooling device 3 is combined with the converter 1. A forward section 14a of a conduct extends from the cooling device 3 to a pole 13 and further extends inside the pole 13 to the top region of the pole 13. At a connection 14c in the top region of the pole 13, the forward section 14a is connected to a return section 14b of the conduct which extends through the pole 13 and the ground back to the cooling device 3. The forward section 14a, the connecting section 14c and the return section 14b form a conduct loop through which a heat transport medium, such as a liquid transport medium, can flow during operation. Preferably, the cooling device 3 comprises a pump or the like for forcing the heat transport medium through the conduct loop. In the example shown, the pole 13 is founded using a foundation 12 in the ground for stability reasons.

The outer wall of the pole 13 comprises at least one air inlet opening 17a and at least one air outlet opening 17b. At least one air channel 16 extends from the air inlet opening 17a to the air outlet opening 17b. As indicated by two arrows, ambiance air can enter the air channel via the air inlet opening 17a, can flow through the at least one air channel 16 and can leave the interior of the pole 13 via the air outlet opening 17b. Therefore, heat which is transferred from the cooling device 3 away from the converter 1 via the heat transport medium inside the conduct loop can be transferred inside the pole 13 to the air which flows through the at least one air channel 16. Cooling of the converter is improved thereby.

Figure 2:
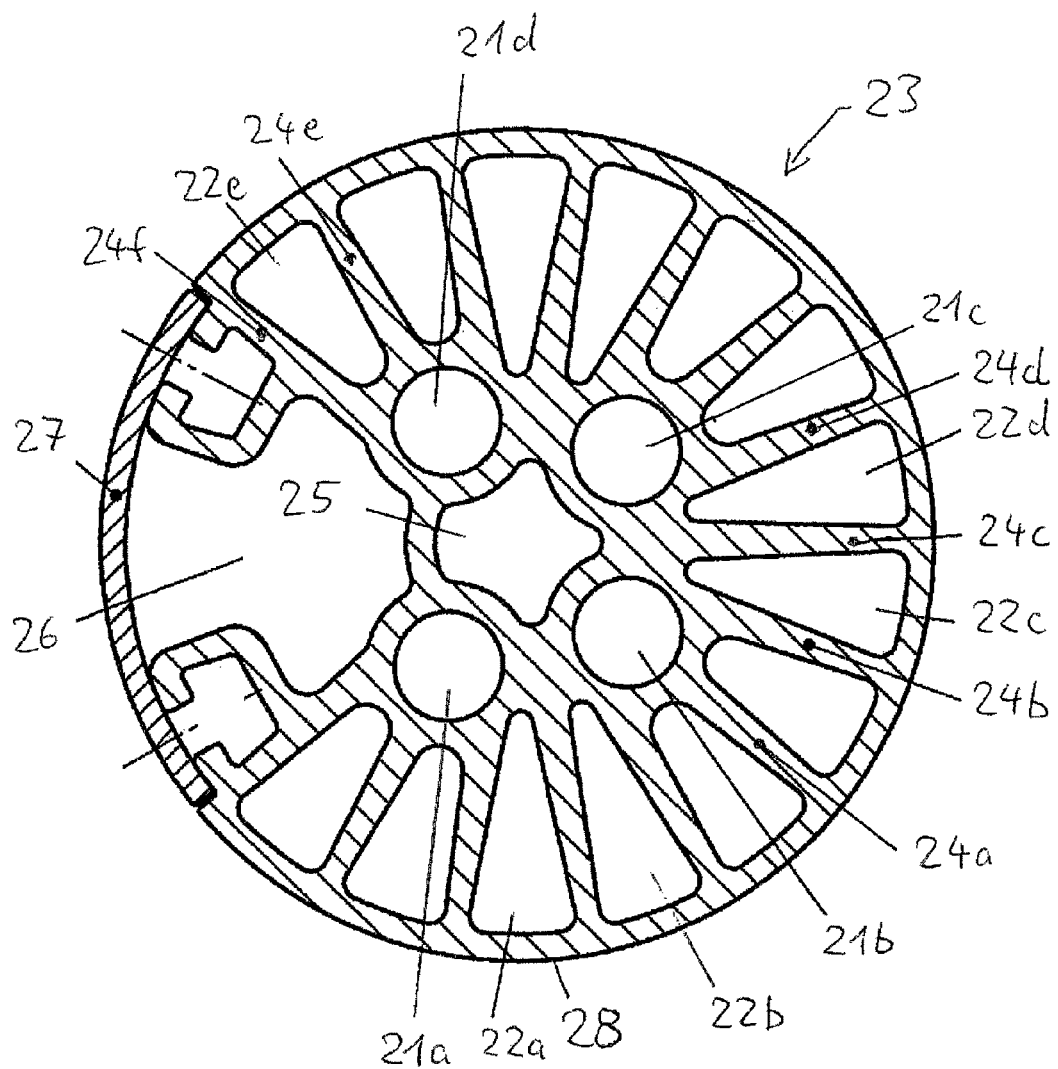
FIG. 2 a cross section of a pole or supporting structure.

FIG. 2 shows a specific embodiment of a profile of a pole 23 which can be used for the pole 13 of FIG. 1, for example, or for any other pole or supporting structure in connection with the present invention. The cross section shown in FIG. 2 is, for example, a horizontal cross section, if the pole 23 extends in vertical direction upwards from ground.

The pole 23 comprises four parallel conduct sections 21a, 21b, 21c, 21d which have circular shapes. For example, two of the conduct sections 21 may be forward sections and two may be return sections. The resulting conduct loops may be parallel loops, which means that the same particles of the heat transport medium are not flowing through both conduct loops, before they return to the cooling device at the converter.

The conduct sections 21 are formed in a central region of the pole's cross section. The center of the central region comprises a cavity 25 in order to reduce weight and in order to safe material (for example metal, such as aluminum). Optionally, the center cavity 25 may also be used as an air channel through which ambient air may pass.

Several cooling bodies 24 extend from the central region to an outer wall 28 of the pole 23. In the specific embodiment shown in FIG. 2, there are in total fifteen cooling bodies 24. Some of them are denoted by reference numerals 24a-24f. These cooling bodies 24 extend approximately in radial direction from the central region of the cross section shown in FIG. 2. In the specific example, the outer wall 28 extends on a circle around the central region. More generally speaking, the outer wall extends around the central region. Therefore, the outer wall 28 and in each case two neighboring cooling bodies 24 delimit one air channel 22 having an approximately triangular shape in the cross section. In the specific embodiment, there are fourteen air channels 22, corresponding to the fifteen cooling bodies. Some of the air channels are denoted by reference numerals 22a-22e.

The number of the conduct sections in the central region, the number of the cooling bodies which extend in radial direction and, therefore, the number of the air channels delimited by each pair of neighboring cooling bodies may vary.

In the specific embodiment shown in FIG. 2, on the left hand side of FIG. 2, a space 26 is provided which may be used for placing electric cables inside the space 26. A removable cover 27 covers the space 26. The cover 27 follows the circular outline of the pole 23. In other embodiments, the space 26 and the cover 27 can be omitted.

The cross section shown in FIG. 2 is preferably constant, at least over a significant part of the pole's extension in a direction perpendicular to the image plane of FIG. 2. A significant part of the lengthwise extension is, for example, 50% and preferably more than 70% of the total lengthwise extension of the pole. However, air inlet openings and air outlet openings similar to the openings 17 shown in FIG. 1 are formed in the wall 28 of the pole 23 at desired location. These inlet and outlet openings are not shown in FIG. 2.

The invention claimed is:

1. An arrangement for operating a current converter comprising:
    a current converter, wherein: the converter is located at a path of travel of land vehicles or at a parking space of a land vehicle; and the converter is adapted to support operation of at least one vehicle,
    a cooling device, wherein: the converter is combined with the cooling device; and, the cooling device is adapted to cool the converter during operation;
    a heat transport medium, wherein: the cooling device is designed to use the heat transport medium in order to transport heat away from the converter;
    at least one pole and/or at least one supporting structure which is also located at the path of travel or at the parking space, wherein:
    the pole and/or the supporting structure extends upwards from ground;
    a conduct loop for conducting the heat transport medium, wherein:
    during operation of the conduct loop, the heat transport medium circulates from the cooling device through a forward section of the conduct loop and a return section of the conduct loop back to the cooling device and,
    the forward section and the return section of the conduct loop extend from the cooling device to the pole and/or to the supporting structure and also extend inside the pole and/or inside the supporting structure; and a heat exchanger, wherein: the heat exchanger is integrated in the pole and/or the supporting structure; the heat exchanger transfers heat during operation of the conduct loop from the heat transport medium inside the pole and/or inside the supporting structure to the ambiance.

2. The arrangement of claim 1, wherein the forward section and the return section of the conduct loop extend through ground and/or at the surface of the ground from the cooling device to the pole and/or to the supporting structure.

3. The arrangement of claim 1, wherein: the heat exchanger integrated in the pole and/or the supporting structure further comprises cooling bodies extending away from the surface of the conduct loop inside the pole and/or inside the supporting structure for conducting heat away from the conduct loop through the material of the cooling bodies; wherein the pole and/or the supporting structure further comprises at least one air channel which extends from an air inlet opening of the pole and/or of the supporting structure upwards to an air outlet opening of the pole and/or of the supporting structure; and, at least one of the cooling bodies forms at least part of a wall of the at least one air channel.

4. The arrangement of claim 2, wherein: the heat exchanger integrated in the pole and/or the supporting structure further comprises cooling bodies extending away from the surface of the conduct loop inside the pole and/or inside the supporting structure for conducting heat away from the conduct loop through the material of the cooling bodies; the pole and/or the supporting structure further comprises at least one air channel which extends from an air inlet opening of the pole and/or of the supporting structure upwards to an air outlet opening of the pole and/or of the supporting structure; and, at least one of the cooling bodies forms at least part of a wall of the at least one air channel.

5. A method of operating a current converter comprising:
    a current converter, wherein: the converter is operated at a path of travel of land vehicles or at a parking space of a land vehicle; and, the converter is adapted to support operation of at least one vehicle;
    a cooling device, wherein the cooling device is used to cool the converter during operation;
    a heat transport medium, wherein the cooling device uses the heat transport medium for transport of heat away from the converter;
    at least one pole and/or at least one supporting structure which is also located at the path of travel or at the parking space, wherein the pole and/or the at least one supporting structure is used to transfer heat produced during operation of the converter to the ambiance;

a conduct loop, wherein the conduct loop is used for conducting the heat transport medium from the cooling device to the pole and/or to the supporting structure; and, the heat transport medium circulates from the cooling device through a forward section of the conduct loop and a return section of the conduct loop back to the cooling device; and, a heat exchanger, wherein the heat transport medium is conducted through a section of the conduct loop inside the pole and/or inside the supporting structure so that heat is transferred from the heat transport medium inside the pole and/or the supporting structure via the heat exchanger integrated in the pole and/or the supporting structure to the ambiance.

6. The method of claim 5, wherein the heat transport medium is conducted inside the conduct loop through ground and/or at the surface of the ground from the cooling device to the pole and/or to the supporting structure.

7. The method of claim 5, further comprising: at least one cooling body of the heat exchanger, wherein heat from the conduct loop inside the pole and/or inside the supporting structure is conducted away from the surface of the conduct loop inside the pole and/or inside the supporting structure through material of the at least one cooling body of the heat exchanger; at least one air channel, wherein the heat is transferred from the at least one cooling body, which forms at least part of a wall of the at least one air channel inside the pole and/or inside the supporting structure, to ambient air inside the air channel; and an inlet opening and outlet opening of the pole, wherein: the ambient air flows from the air inlet opening of the pole and/or of the supporting structure upwards to the air outlet opening of the pole and/or of the supporting structure.

8. The method of claim 6, further comprising: at least one cooling body of the heat exchanger, wherein heat from the conduct loop inside the pole and/or inside the supporting structure is conducted away from the surface of the conduct loop inside the pole and/or inside the supporting structure through material of the at least one cooling body of the heat exchanger; at least one air channel, wherein the heat is transferred from the at least one cooling body, which forms at least part of a wall of the at least one air channel inside the pole and/or inside the supporting structure, to ambient air inside the air channel; and an inlet opening and outlet opening of the pole, wherein: the ambient air flows from the air inlet opening of the pole and/or of the supporting structure upwards to the air outlet opening of the pole and/or of the supporting structure.

* * * * *